United States Patent [19]
Chen et al.

[11] Patent Number: 5,100,870
[45] Date of Patent: Mar. 31, 1992

[54] METHOD OF MAKING A SUPERCONDUCTING OXIDE COMPRISING CONTACTING A MELT WITH AN OXYGEN-CONTAINING ATMOSPHERE

[75] Inventors: Ho S. Chen, Clinton Township, Hunterdon County; George S. Indig, Basking Ridge; Lionel C. Kimerling, Westfield, all of N.J.

[73] Assignee: AT&T Bell Laboratories, Murray Hill, N.J.

[21] Appl. No.: 630,747

[22] Filed: Dec. 20, 1990

Related U.S. Application Data

[63] Continuation-in-part of Ser. No. 142,752, Jan. 11, 1988, abandoned.

[51] Int. Cl.$^5$ .............................................. H01L 39/00
[52] U.S. Cl. ..................................... 505/1; 156/617.1; 156/621; 427/62; 505/736
[58] Field of Search ................... 505/1, 736; 427/62; 156/617.1, 621

[56] References Cited

U.S. PATENT DOCUMENTS

| | | | |
|---|---|---|---|
| 4,724,038 | 2/1988 | Pastor et al. | 156/617.1 |
| 4,826,808 | 5/1989 | Yurek et al. | 252/521 |
| 4,902,359 | 2/1990 | Takeuchi et al. | 148/421 |
| 4,962,085 | 10/1990 | deBarbadillo, II et al. | 505/736 |

FOREIGN PATENT DOCUMENTS

| | | | |
|---|---|---|---|
| 0285106 | 10/1988 | European Pat. Off. | 437/910 |
| 3812662 | 10/1988 | Fed. Rep. of Germany | 505/741 |
| 0010518 | 1/1989 | Japan | 505/704 |

OTHER PUBLICATIONS

Gao et al., Appl. Phys. Letts, 55 (Nov. 1989) 2227.
Chen et al., Appl. Phys. Letts. 53 (Aug. 1988) 705.
Yavari et al., Europhysics Letts, 4 (Dec. 1987) 1315.
"Transport Properties of Tl-Based Superconductors Prepared by Liquid-Gas-Solidification Process", by H. S. Chen et al., *Modern Physics Letters*, B. vol. 3, No. 13 (1989), pp. 975-980.

(List continued on next page.)

*Primary Examiner*—Uprendra Roy
*Attorney, Agent, or Firm*—Eugen E. Pacher

[57] ABSTRACT

Disclosed is a broadly applicable method for making an article that, exemplarily comprises a superconductive oxide body, including a thin layer on a substrate, or powder particles. In a preferred embodiment, the method comprises forming a precursor melt and contacting at least a part of the melt with oxygen such that the concentration of oxygen in the part of the melt increase to a critical concentration, resulting in formation of the desired oxide, substantially without drop in temperature. The precursor melt comprises at least one metallic element M, and at least the part of the melt is at a temperature T, with $T_m < T < T_o$, where $T_m$ is the freezing temperature of the melt and $T_o$ is the melting temperature of the superconductive oxide. In an exemplary embodiment the melt consists essentially of Yb, Ba, and Cu in 1:2:3 atomic ratio, T is about 900° C. A layer of superconductive oxide on a Sr-TiO$_3$ substrate is formed by dipping the hot (900° C.) substrate into the melt, exposing the melt-coated substrate to oxygen such that oxygenation and solidification of the coating results, and furnace cooling the coated substrate in oxygen. The thus produced coating has composition Yb-Ba$_2$Cu$_3$O$_{9-\delta}$ ($\delta \sim 2.1$), is essentially single phase, strongly textured, has T$_c$ of about 85K and J$_c$ of about $3 \times 10^4$ A/cm$^2$. An aspect of the invention is the fact that the precursor melt need not be stoichiometric. For instance, we have formed a layer of composition YbBa$_2$Cu$_3$O$_7$ from a melt of composition Yb$_2$BaCu. The inventive technique can produce compositionally essentially homogeneous material. It is readily adaptable to produce ceramics (including high T$_c$ superconductors) and other materials (e.g., AlN) in a variety of shapes (including wire tape, and powders) by a variety of techniques (including continuous processing). The inventive method can also be used to form a superconductive bond between two pre-existing ceramic superconductive bodies.

18 Claims, 2 Drawing Sheets

OTHER PUBLICATIONS

"YbBa$_2$Cu$_3$O$_7$ Epitaxial Films Grown by a Ag-Enhanced Liquid Gas Solidification Process", by H. S. Chen et al., *Applied Physics Letters, 55(2), 10 Jul. 1989, pp. 191-193.*

*Japanese Journal of Applied Physics*, vol. 26, No. 8 "High T Superconductor Prepared by Oxidation of a Liquid-Quenched Yb$_1$Ba$_2$Cu$_3$ Alloy Foil in Air", by K. Matsuzaki et al., pp. L1310-L1312, Aug. 1987.

*Applied Physics Letters*, 51(7) "EuBa$_2$Cu$_3$O$_x$ produced by Oxidation of a Rapidly Solidified Precursor Alloy: An Alternative Preparation Method for High T$_c$ Ceramic Superconductors", by R. Haldar et al., pp. 538-539, 17 Aug. 1987.

*Japanese Journal of Applied Physics*, vol. 26, No. 4, "Preparation of a High T$_c$ Superconductor by Oxidation of an Amorphous La$_{1.8}$Sr$_{0.2}$Cu Alloy Ribbon in Air", by K. Matsuzaki et al., pp. L334-L336, Apr. 1987.

*Zeitschr. f. Physik B-Condensed Matter*, vol. 64, 189 (1986), "Possible High T$_c$ Superconductivity in the Ba-La-Cu-O System" by J. G. Bednorz and K. A. Muller, pp. 189-193.

*Physical Review Letters*, vol. 58(9), 2 Mar. 1987 "Superconductivity at 93K in a New Mixed-Phase Y-Ba-Cu-O Compound System at Ambient Pressure" by M. K. Wu et al., pp. 908-910.

*Physical Review Letters*, vol. 58(9) 2 Mar. 1987 "High Pressure Study of the New Y-Ba-Cu-O Superconducting Compound System" by P. H. Hor et al., pp. 911-912.

*Physical Review Letters*, vol. 58(16) 20 Apr. 1987 "Bulk Superconductivity at 91K in Single-Phase Oxygen-Deficient Perovskite Ba$_2$YCu$_3$O$_{9-\delta}$" by R. J. Cava et al., pp. 1676-1679.

*Superconductor Applications: SQUID and MACHINES.* B. B. Schwartz and S. Foner, editors, Plenum Press 1981.

*Superconductor Materials, Science, Metallurgy, Fabrication, and Applications*, by S. Foner and B. B. Schartz Plenum Press 1981.

*Advanced Ceramic Materials*, vol. 2, No. 3B, Special Issue, 1987 "Fabrication of Ceramic Articles from High T$_v$ Superconducting Oxides" by D. W. Johnson et al., pp. 364-371.

*Advanced Ceramic Materials*, vol. 2, No. 3B, Special Issue, 1987, "Rapid Solidification of Oxide Superconductors in the Y-Ba-Cu-O System" by J. McKittrick et al., pp. 353-363.

*Applied Physics Letters* 51(12), 21 Sep. 1987, "Fabrication of Dense Ba$_2$YCU$_3$O$_{7-\delta}$Superconductor Wire by Molten Oxide Processing" by S. Jin et al., pp. 943-945.

*Physical Review Letters*, vol. 58(18), 4 May 1987 "New Superconducting Cuprate Perovskites" by D. W. Murphy et al., pp. 1888-1890.

*Applied Physical Letters*, 51(22) 30 Nov. 1987, "Melt-Processible Rare Earth-Ba-Cu-O Superconductors Based on Molten Ba-Cu Oxides" by A. M. Hermann et al., pp. 1854-1856.

*Zone Melting* by W. G. Pfann (John Wiley & Sons, Inc.) Second Edition, pp. 282-284.

*Japanese Journal of Applied Physics*, Part 2, vol. 26(10), Oct. 1987, "High-T$_c$ Superconductor Prepared by Oxidation of a Melt-Spun Eu$_1$Ba$_2$Cu$_3$ Alloy Ribbon", by K. Matsuzaki et al., pp. L1610-L1612.

METHOD OF MAKING A SUPERCONDUCTING OXIDE COMPRISING CONTACTING A MELT WITH AN OXYGEN-CONTAINING ATMOSPHERE

FIELD OF THE INVENTION

This invention pertains to methods of producing a body (including a thin body such as a film on a substrate) from a melt, and to articles comprising a body produced by such a method. In an exemplary embodiment the body is a superconductive oxide body.

BACKGROUND OF THE INVENTION

From the discovery of superconductivity in 1911 to the recent past, essentially all known superconducting materials were elemental metals (e.g., Hg, the first known superconductor) or metal alloys or intermetallic compounds (e.g., $Nb_3Ge$, probably the material with the highest transition temperature $T_c$ known prior to 1986).

Recently, superconductivity was discovered in a new class of materials, namely, metal oxides. See, for instance, J. G. Bednorz and K. A. Müller, *Zeitschr. f. Physik B—Condensed Matter*, Vol. 64, 189 (1986), which reports superconductivity in lanthanum barium copper oxide.

The above report stimulated worldwide research activity, which very quickly resulted in further significant progress. The progress has resulted, inter alia, to date in the discovery that compositions in the Y—Ba—Cu—O system can have superconductive transition temperatures $T_c$ above 77K, the boiling temperature of liquid $N_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of composition and processing techniques that result in the formation of bulk samples of material that can be substantially single phase material and can have $T_c$ above 90K (see, for instance, R. J. Cava et al, *Physical Review Letters*, Vol. 58(16), pp. 1676–1679), incorporated herein by reference.

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be one of the most advantageous cryogenic refrigerants, and attainment of superconductivity at or above liquid nitrogen temperature was a long-sought goal which until very recently appeared almost unreachable.

For a general overview of some potential applications of superconductors see, for instance, B. B. Schwartz and S. Foner, editors, *Superconductor Applications: SQUIDS and MACHINES*, and S. Foner and B. B. Schwartz, editors, *Superconductor Material Science, Metallurgy, Fabrications, and Applications*, Plenum Press 1981. Among the applications are power transmission lines, rotating machinery, and superconducting magnets for, e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials.

Two general approaches for forming superconductive oxide bodies are known to the art. Thin films are formed by deposition of material on a substrate (e.g., by sputtering, evaporation, or decomposition of a solution), followed by a heat treatment that produces the appropriate crystal structure and composition (typically by adjustment of the oxygen content). On the other hand, bulk bodies and thick films are generally produced by synthesizing a powder of the appropriate composition (e.g., $YBa_2Cu_3O_x$, $x \sim 7$), forming the powder into the desired shape (e.g., by hot pressing, drawing, extrusion, or silk screening of a slurry), and heat treating the resulting body such that sintering occurs, and such that the sintered material has the appropriate crystal structure and composition. A further method which comprises melting of the oxide powder and forming bulk bodies by solidification of the oxide melt is discussed below.

The critical temperature $T_c$, i.e., the temperature at which a given body becomes superconductive, is an important parameter of a superconductor. Another important parameter is the maximum current density that can be supported by a body in the superconductive state. This "critical current density" $J_c$ decreases with both increasing temperature and increasing magnetic field.

Work to date has shown that at least some thin films of high $T_c$ superconductors (e.g., $YBa_2Cu_3O_7$) can have high $J_c$ (of order $10^6$ A/cm$^2$ at 77K), with $J_c$ being relatively weakly dependent on magnetic field. Work has also shown that, even though individual particles (crystallites) of superconductive oxides (e.g., $YBa_2Cu_3O_7$) can have large internal critical current density $J_c$ (of order $10^6$ A/cm$^2$), the critical current density of bulk bodies produced by sintering of the particles is relatively small, exemplarily of order $10^3$ A/cm$^2$ in zero magnetic field (H=0), and strongly dependent on magnetic field. This huge difference between the $J_c$ of a single particle and of an assembly of particles is generally attributed to the presence of weak links between adjacent particles (by "weak links" we mean herein any inhomogeneity, frequently associated with the surface of a particle or with the contact between two particles, that limits the density of supercurrent that can flow). A critical current density of the order of $10^3$ A/cm$^2$ at H=0 is generally thought to be too small for most technologically important applications. Furthermore, the $J_c$ of sintered bulk superconductive oxide bodies decreases rapidly as a function of magnetic field, further limiting the current that could be carried by such prior art bodies.

As discussed above, most bulk high $T_c$ superconductive bodies are produced by ceramic processing techniques that involve sintering of powder material at temperatures below the melting temperature of the material. See, for instance, D. W. Johnson et al, *Advanced Ceramic Material*, Vol. 2(3B), July 1987, pp. 364–371. However, recently work was reported that represents a significant departure from the conventional (i.e., ceramic) processing method since it involves melting of the metal oxide powder. See S. Jin et al, *Applied Physics Letters*, Vol. 51(12), pp. 943–945, (1987) and U.S. patent application Ser. No. 126,083, filed Nov. 27, 1987, which is a continuation-in-part of U.S. patent application Ser.

No. 062,529, filed June 12, 1987, now abandoned. The "metallurgical" processing technique of Jin et al can result in essentially 100% dense, essentially single phase material in which the grains typically are of relatively large size and typically are non-randomly oriented. Bulk bodies produced by this technique can have substantially larger $J_c$ than has been reported for sintered bodies of the same composition, and, significantly, $J_c$ can decrease more slowly with increasing magnetic field than has been reported for sintered bodies. These improvements are thought to be due at least in part to improved intergranular contact and/or to the presence of orientational correlation between neighboring crystallites. However, even though the melting technique of Jin et al results in substantially improved $J_c$, the observed behavior still suggests that $J_c$ is limited at least to some extent by weak links, possibly associated with compositional inhomogeneity.

In view of the immense economic potential of high $T_c$ superconductors, a simple, scalable processing method which is readily applicable to continuous processing and the formation of composite structures, and which has the potential for producing improved bodies, especially material with improved compositional uniformity, would be of great interest. This application discloses such a method. Furthermore, the disclosed method is believed to have broader applicability. For instance, it is thought that it can be advantageously used to produce at least some non-superconductive ceramics, and to produce such nonoxidic materials as aluminum nitride.

DEFINITIONS

The Ba-cuprate system herein is the class of nominal general formula $(M_{1-x}M'_x)_{1+y}Ba_{2-y}Cu_3O_{9-\delta}$, where M and M' are chosen from Y, Eu, Nd, Sm, Gd, Dy, Ho, Er, Tm, Yb, Lu, La, Sc, Sr or combinations thereof, with typically $0 \leq x \leq 1$, $0 \leq y \leq 1$, and $1 < \delta < 3$. For $y=0$, the material is frequently referred to as a "1-2-3-type" material. In 1-2-3-type materials, the optimal oxygen content frequently corresponds to $\delta \sim 2$. Reference to a compound such as $YBa_2Cu_3O_7$ is intended to include compositions in which $\delta$ is not exactly equal to 2, e.g., $\delta = 2.1$. For examples see, for instance, D. W. Murphy et al, *Physical Review Letters*, Vol. 58(18), pp. 1888–1890 (1987), incorporated herein by reference.

The La-cuprate system herein is the class of oxides of nominal general formula $La_{2-x}M_xCuO_{4-\epsilon}$, where M is one or more divalent metals (e.g., Ba, Sr, Ca), and $x \geq 0.05$, and $0 \geq \epsilon \geq 0.5$. Both Ba-cuprates and La-cuprates are generally considered to be ceramic materials.

The phrase "crystal structure associated with superconductivity in the oxide" (or equivalent phrases) is intended to include a high-temperature precursor phase of the superconductive phase, if such a precursor phase exists. For instance, in the well-known 1-2-3 compound $YBa_2Cu_3O_7$ the precursor phase has tetragonal crystal structure and the superconductive phase has orthorhombic structure, with the transition temperature being in the approximate range 500° C.–650° C., depending on the oxygen pressure. In this exemplary case the tetragonal phase has a crystal structure that is associated with superconductivity in the oxide.

A "superconductive body" herein is a body (including a layer on a substrate) which comprises a sufficient amount of superconductive material such that, at some temperature below the critical temperature, a d.c. electrical current can flow through at least part of the body without resistance.

THE INVENTION

We have discovered a material processing technique which differs fundamentally from all relevant commercially significant prior art processes known to us. The processing technique is believed to be broadly applicable to forming bodies that comprise chemical compounds such as metal oxides and nitrides. Regardless of the breadth of applicability, we currently consider the technique to be particularly promising for making high $T_c$ ceramic superconductors.

In one embodiment the inventive process comprises forming a melt (the precursor melt) that comprises all but one of the chemical elements that make up the compound to be formed (the first compound), introducing the missing element (in the general case to be designated by the letter G) into at least a portion of the precursor melt such that the concentration of G in the portion of the melt reaches a critical concentration and consequently a quantity of the first compound is formed from the portion of the melt. (The term "the melt", and terms analogous thereto, herein are intended to mean "at least a portion of the melt", unless stated otherwise or inappropriate in the context. Furthermore, the term "the portion of the melt", and terms analogous thereto, are intended herein to mean "at least the portion of the melt", unless stated otherwise or inappropriate in the context). The introduction of G into the precursor melt typically is by exposure of the molten material to a G-containing atmosphere, e.g., to an oxygen or nitrogen atmosphere, or to a mixture of an inert gas such as He and G. It is to be noted that the temperature at which the first compound is formed typically is the same or higher than the temperature T of the precursor melt. More generally, the temperature at which solid product (i.e., the first compound) is formed is higher than $T_m$, the freezing temperature of the precursor melt, and we intend herein the phrases "essentially without drop in temperature", "substantially without drop in temperature", and equivalent ones to have, in the context of solidification of melt material according to the invention, the meaning "without drop of the temperature below $T_m$". This differs fundamentally from conventional solidification which involves a lowering of the melt temperature to a temperature below $T_m$.

In another embodiment the invention is a process for yielding product of a composition comprising at least two (frequently three or more) different elements, the process involving solidification of a first composition from a liquid containing at least one (frequently two or more) of said elements. Significantly, at least a part of the liquid is at a temperature T between $T_m$ and $T_o$, where $T_m < T_o$, with $T_o$ being the melting temperature associated with the first composition. Furthermore, at least the part of the liquid is contacted with an element G that is one of the at least two different elements. This element is also referred to as the "solidifying element". The contacting is carried out such that the concentration of G in the part of the liquid is increased such that, without a drop in the temperature of the part of the liquid to $T_m$ or below, solid material of the first composition is formed from the part of the liquid. Exemplarily, the liquid is molten Al, the soldifying element is nitrogen, and the product is Al N.

The above referred to critical concentration is that concentration of G in the melt at which, at the temperature T and taking into account the existing nucleation conditions, the first compound is nucleated in the portion of the melt and is stable with respect to the melt, whereas all other compounds that could be formed from the portion of the melt do not form or their nucleation is relatively unstable with respect to the melt.

The above described embodiment of the invention can be modified in various ways. For instance, the portion of the precursor melt can comprise, prior to the above referred to introduction of G, a sub-critical concentration of G. As a further example, the precursor melt may contain one or more chemical elements (X) that are not constituents of the first compound. Such an element may be present in the melt to, for instance, improve the solubility properties of the melt, or to improve the mechanical, thermal, electrical or other properties of the material formed by the inventive process. Furthermore, at least in principle, it is possible that more than one element (i.e., G, G', ...) be introduced into the melt, or into the portion of the melt, and the element G can be transferred through a massive melt to a substrate/melt interface, provided the concentration of G in the melt is tightly controlled.

The precursor melt typically is an elemental melt, i.e., formed from a charge (the precursor material) that contains at least one of the constituents of the first compound in elemental form. Frequently all of the constituents are present in elemental form, but at least in some cases it may be desirable if one or more of the constituents is added as a compound. For instance, addition of a relatively insoluble constituent to the melt in the form of an oxide may improve the solubility properties of the melt.

Although the melt may be stoichiometric, i.e., contain the relevant elements in the ratio in which theses elements are found in the first compound, this is not necessarily so. Indeed, in some promising embodiments the melt is non-stoichiometric, as will be discussed in more detail below. Typically, but not necessarily, the melt is compositionally essentially homogeneous. By "essentially homogenous" we mean that the melt may comprise zones of phase separation that have dimensions of the order of about 10 atomic diameters or less. Homogeneous melts result if the constituents of the melt are miscible at the temperature T. If the constituents are not miscible then mechanical means (e.g., ultrasonic agitation) may be able to produce an essentially homogeneous melt. It is to be understood that a melt will be considered to be homogeneous despite the presence of a thin boundary layer adjacent to a melt/substrate interface, where the boundary layer composition may differ from that of the bulk melt. Other possible expedients for producing a homogeneous melt are the use of a relatively high melt temperature, addition of one or more "homogenizer" elements, or introduction of one or more of the constituents of the melt in the form of an appropriate compound.

The temperature T is selected such that $T_m < T < T_o$, where $T_m$ is the freezing temperature of the precursor melt, and $T_o$ is the melting temperature of the first compound. It will be understood that T need not be uniform throughout the portion of the melt but, for instance, can have a gradient imposed by external conditions or due to exothermic growth of the first compound. The solidified first compound can be subjected to any desired treatment in the solid state. For instance, the first compound can be heat treated in a G-containing atmosphere to adjust the concentration of G in the material and/or to produce a desired crystal structure. It will also be understood that the melt, or the portion of the melt, need not be kept at a constant temperature. For instance, in some cases it will be advantageous to raise the melt to a relatively high temperature (possibly even above $T_o$) to, exemplarily, increase the solubility of a constituent of the melt, followed by a lowering of the melt temperature to the temperature T between $T_m$ and $T_o$, and exposure of the melt to G.

It is envisaged that at least in some embodiments material other than the first compound will also be formed. For instance, this may be the case if the composition of the melt, or of the portion of the melt, differs significantly from the composition of the first compound. However, in all cases at least a significant fraction of the solid material formed by means of the inventive process will be first compound material. Typically, the first compound material is formed on a substrate, and the other material (if present) overlies the first compound material.

Nucleation of the first compound is considered to be a significant aspect of the invention. Whereas nucleation does not necessarily require that the portion of the melt is in contact with a substrate, in many embodiments of the invention this will be the case. A variety of materials can serve as substrates, including single crystal and polycrystalline metal oxides, semiconductors, and metals. As will be discussed in more detail below, the inventive technique makes possible the use of substrate materials that could not be used in conjunction with prior art techniques, due to undesirable substrate/first compound interaction. Some embodiments of the inventive process permit continuous formation of first compound material, e.g., the continuous formation of high $T_c$ superconductive material on a substrate such as a copper or silver wire.

In an exemplary and significant embodiment of the invention the molten material consists substantially of molten metal (the melt contains one or more metallic elements M, M', ..., and the presence of minor amounts of one or more non-metallic elements is not excluded), and G is oxygen, such that the first compound substantially is a metal oxide. In a currently preferred embodiment the oxide is a high $T_c$ superconductive oxide (e.g., Ba-cuprate or La-cuprate), and, for the sake of concreteness, the discussion from hereon will be primarily in terms of this preferred embodiment. No limitation of the invention to superconductive oxides is thereby implied. For instance, other (i.e., non-superconductive) ceramics can be produced by means of the inventive method. Such ceramics may, for instance, be used as dielectric in capacitors. Exemplary of non-oxidic materials that can be produced by the inventive method are nitrides such as AlN.

As indicated above, high $T_c$ superconductive oxide bodies can be produced by an embodiment of the inventive process that comprises melting of the cationic constituents (e.g., Yb, Ba, and Cu) of the intended oxide such that a compositionally homogeneous (or essentially homogeneous) melt results, and that further comprises contacting all or a portion of the melt with oxygen such that the desired first compound is formed from the oxygenated melt, without deliberate cooling of the melt and without drop of the melt temperature to or below $T_m$, i.e., substantially without a drop in the temperature of the melt. The atomic ratio of the metal elements is frequently the same in the melt as it is the first compound. However, this is not necessarily so, and the melt composition in at least some cases can differ substantially from that of the first compound. This unexpected feature of the inventive process indicates that under the conditions of the process, and in at least some materials systems, formation of the one compound is strongly favored over that of other possible compounds. This favored compound is the first compound. For instance, we have found that the formation of the compound $YbBa_2Cu_3O_x(x\sim 7)$ is favored over that of other (Yb, Ba, Cu)-oxides such as $Yb_2BaCuO_y(y\sim 5)$ over a wide range of compositions. We currently believe that superconductive Ba-cuprates such as $YBa_2Cu_3O_7$ are favored over the corresponding non-superconductive compounds, provided all the cationic constituents of a given superconductive cuprate are present in the melt in concentrations that assure their statistical availability at the nucleation site.

The ability to form a given first compound from a non-stoichiometric melt has considerable practical significance. For instance, it makes possible the use of the method in cases where an essentially homogeneous stoichiometric melt cannot be formed, but where an essentially homogeneous melt containing all the relevant elements can be formed at some other ratio of the constituent elements. For instance, Y, Ba, and Cu in the ratio 1:2:3 do not form a homogeneous melt at a useful temperature but can do so if the copper content is substantially higher.

Other reasons for using a non-stoichiometric melt composition also exist. For instance, if a copper substrate is used in conjunction with a cuprate such as $YbBa_2Cu_3O_7$ then it may be advantageous if the precursor melt is somewhat Cu-deficient, since it can be expected that at least some Cu from the substrate will be dissolved in the melt. Furthermore, it is contemplated that optionally the melt may contain one (or possibly more) further element (e.g., Ag, Au, or Cd) that does not interfere with the formation of the desired compound and whose presence may improve certain properties of a body formed from the melt. For instance, the presence of Ag in 1-2-3-type material may result in improved electrical and thermal stability of a superconductive body formed from the material. It is also contemplated that the presence of such a constituent may result, at least in some cases, in improved processing, as will be discussed in more detail below.

Solidification of the superconductive oxide typically is initiated at a predetermined location in the melt (e.g., at the interface between the melt and a solid substrate), and proceeds such that at least a substantial portion of the solidified material has the composition and crystal structure that is associated with superconductivity. The oxygen content of the as-solidified material may, but need not, correspond to the optimal oxygen content of the superconductive material. If the initial oxygen content of the solidified material does not correspond to the desired oxygen content then an adjustment can be brought about during a later heat treatment, typically at a lower temperature in an $O_2$-containing atmosphere. Typically an oxygen pressure of at least about 0.01 atmospheres is required to avoid decomposition of a superconductive oxide such as a barium cuprate. It will also be understood that the intial melt may be essentially oxygen-free or may contain some oxygen, provided the oxygen concentration is below the critical concentration at which, at the temperature of the melt, solidification occurs. Since the formation of the oxide frequently involves an exothermic reaction the initial temperature of the solidified material may be higher than that of the melt.

The temperature T of the melt is chosen such that $T_m<T<T_o$. The temperature typically is also chosen with a view towards maintaining a stable melt composition and towards minimizing the interaction of the melt with the substrate. For instance, if one of the metallic elements has a relatively high vapor pressure (as does, for instance, Ba) it may be advantageous to choose a relatively low melt temperature. However, other considerations, e.g., melt miscibility, may require the choice of a relatively high melt temperature. Those skilled in the art will generally be able to determine an appropriate melt temperature with, at most, a minor amount of experimentation.

Among the significant advantages of the invention is the possibility of producing superconductive oxide bodies of improved compositional homogeneity, as compared to bodies produced by prior art techniques. Not only are the metal constituents distributed essentially uniformly in superconductive metal oxide material produced according the invention (reflecting the essentially uniform distribution of the constituents of the homogeneous melt and, at least in the case of a stoichiometric melt, the absence of any thermodynamic driving force towards phase separation during solidification; the former is a distinguishing aspect with regard to the sintering method, and the latter with regard to the prior art melting technique), but so is the solidification-inducing element, e.g., oxygen. The improved homogeneity is thought to be primarily due to the fact that a single, well-defined reaction product of the reaction of oxygen (or other solidification-inducing element) with the melt can be formed. A contributing possibility is the relatively rapid diffusion of oxygen in the melt, and the much slower diffusion of oxygen in the solidified material. Since the relatively low $J_c$ of prior art superconductive bodies is generally ascribed to the presence of weak links which, in turn, are thought to be related to the existence of compositional inhomogeneities, the ability to produce material of improved compositional homogeneity is considered to be a significant aspect of the invention.

The inventive method has other advantageous features. For instance, it is typically a one-step procedure (production of the precursor material requires only melting of the metals) whereas prior art sintering techniques require repeated calcining and comminuting of the starting material. As compared to the prior art melt technique, melt confinement can be significantly less difficult in the inventive method, since the melt in the latter method is typically at a substantially lower temperature than in the former, and since molten metal typically is less reactive with refractory materials of the type likely to be used to confine the melt than is molten oxide. The inventive method is also well adapted to the coating of a substrate (including a non-planar substrate such as a wire) with a layer of superconductive material, and even to carrying out such coating in a continuous manner. Since the inventive process can be carried out at a relatively low temperature (e.g., melt temperature of about 900° C. for $YbBa_2Cu_3O_7$) and frequently does not require maintenance of the melt and/or solid oxide material in contact with the substrate at or close to the solidification temperature for any extended period of time, substrate materials which poison the superconductive oxide thereon when used in prior art methods may be acceptable substrates for the practice of the inventive process. For instance, a sintered $Al_2O_3$ substrate has been found to be an acceptable substrate for purposes of the inventive process but is generally considered unsuitable for use in prior art processes. Ag and Au and, possibly, other metals such as the refractory metals and even Cu are also expected to be useful substrate materials and/or barrier layers when used in the inventive process.

In order to attain compositional homogeneity of the solidified material, it is necessary that the melt be essentially compositionally homogeneous. Typically this implies that the metal constituents are miscible. However, mechanical mixing schemes may be devised which also can produce essentially homogeneous melts. Not all of the metals of interest with regard to high $T_c$ superconductors are miscible in the melt. For instance, Y, Ba, and Cu (ratio 1:2:3) do not form a homogeneous melt at 900° C., whereas in the same ratio and at the same temperature Yb, Ba, and Cu (or Eu, Ba, and Cu) do. However, at least in some cases the addition of one or more further elements (to be termed the "homogenizer") can result in a homogeneous melt. For instance, even though $YBa_2Cu_3$ does not form a homogeneous melt at temperatures of interest herein, $Y_x(Yb$ and/or $Eu)_{1-x}$-$Ba_2Cu_3$ is miscible at such temperatures for some range of $\underline{x}$. Partial substitution of Sr for Ba may also result in improved homogeneity. As a further example, Ag or Cu (or other metal which is miscible with all the "active" constituents of the melt and which does not poison or otherwise negatively affect the properties of the solidified material) is expected to be a suitable homogenizer for, e.g., Ba-cuprates such as $YBa_2Cu_3O_7$.

As indicated above, a melt which is inhomogeneous at a relatively low temperature may be homogeneous at a higher temperature. Thus choice of melt temperature may at least in some cases be a significant aspect of the invention. Furthermore, homogenization by mechanical or other appropriate means of a melt that exhibits some immiscibility may produce a melt that is useful in the practice of the invention. Exemplarily, this requires that the zones of phase separation be at most of the order of about 10 atomic diameters.

A desirable aspect of the inventive method is a relatively short oxygenation time. In order to make possible the rapid distribution of oxygen throughout a quantity of the melt, it may frequently be advantageous to form a relatively thin melt layer on a substrate, e.g., by dipping of a substrate into the melt, or by spinning of the melt onto a substrate. As will be appreciated, it will generally be necessary to arrange the process such that the substrate temperature is at, or close to, the melt temperature when the melt is brought into contact with the substrate. In general, it can be said that the substrate temperature is above $T_m$, the freezing temperature of the melt. Furthermore, it may be advantageous to contact the quantity of melt that is to be solidified with oxygen at a relatively high partial pressure, typically at or above ambient pressure. However, the pressure typically should not be so high as to result in uncontrolled nucleation at the free surface of the melt, or in excessive heat evolution, since this typically would impede the oxygenation of the melt and/or cause inhomogeneity in the solidified material. We currently consider oxygen pressures in the range 0.1–5 atmospheres to be useful, but at least in some cases pressures outside of this range may also be useful.

Another aspect of the invention is associated with the nucleation of crystallites in the oxygenated melt. Nucleation of the phase associated with superconductivity will at least in some cases be enhanced by provision of a substrate that is approximately lattice matched with the desired phase [e.g., (100) $SrTiO_3$ is approximately matched with the basal plane of $YbBa_2Cu_3O_7$]. However, lattice match is optional, and essentially single phase material can be obtained on non-lattice-matched substrates, e.g., single crystal MgO, and polycrystalline substrates, including sintered $Al_2O_3$. Furthermore, the inventive method may not require the presence of a substrate. For instance, the presence of an interface (e.g., liquid/vapor interface), or any appropriate perturbation (e.g., shock wave) may result in nucleation of the desired phase. Exemplarily, a powder of the desired oxide may be formed by introducing droplets of the molten stoichiometric precursor material into an oxygen atmosphere, (e.g., droplets formed by an atomization process) and collecting the resulting particles. These particles can be used in substantially the same way as prior art powder, to produce superconductive bodies.

Solidification of the melt can be carried out in a variety of ways, with the particular choice typically depending on the nature of the body that is to be produced. For instance, the melt can be spun or sprayed onto a substrate, a substrate can be dipped into the melt, the melt can be cast into a die or poured onto a rotating drum, or a substrate such as metal wire or tape can be pulled through the melt or otherwise brought into contact therewith (e.g., by dripping melt onto the moving substrate). Single or multiple applications of liquid melt are possible with or without intervening oxidation. If a non-stoichiometric melt is used, then it may frequently be advantageous to remove the remaining liquid portion of a film formed on a substrate such that a substantially single phase deposit remains. Such removal can, for instance, be by means of a blast of hot gas. It is also possible to apply the melt to a substrate, cause the temperature of the melt to drop below $T_m$ such that the melt solidifies, then reheat (e.g., by laser or electron beam heating) the solidified material such that at least a portion thereof melts, followed by exposure of the molten material to oxygen such that solidification of the desired oxide occurs. Such a process would be advantageously employed to produce superconductive wires and the like and could also be used to, for instance, form a protective ceramic coating on parts such as turbine blades.

The substrate, in addition to providing mechanical support (and, possibly, electrical and thermal stabilization) provides the nucleation site for the superconductive oxide. However, the nucleation site can be provided in a variety of ways, and we contemplate all possible ways to initiate the formation of crystallites. For instance, the interfaces of the melt with particles of a dispersed powder can constitute sites for nucleation. It is expected to even be possible to initiate nucleation at a liquid/gas interface (e.g., on the surface of a melt stream or droplet falling through an oxygen atmosphere). In general, it is believed that heterogeneous nucleation is preferable to homogeneous nucleation.

After solidification of the superconductive oxide it is typically subjected to some further processing steps so as to obtain the desired shape and/or properties. For instance, it will frequently be found desirable to cool the solidified material in an oxygen-containing atmosphere to an appropriate intermediate temperature (e.g., about 500° C. in the case of $YbBa_2Cu_3O_7$) and maintain it at that temperature in the atmosphere, such that the oxygen content of the material is optimized and/or the transformation to the crystal phase that is associated with superconductivity can take place in a controlled manner. Furthermore, in some cases it may be desirable to subject the solidified material to a sintering treatment at a temperature close to the melting temperature of the material.

The inventive method can be applied in a variety of ways. For instance, it can be used to form a superconductive film or layer on a substrate, including a non-planar substrate such as a wire or tube. Bodies can be produced in batch fashion or by a continuous method (both with or without seeding). Replenishment of the melt, to insure steady state conditions, will typically be required, as will be apparent to those skilled in the art. By repeated application of the technique bodies of substantial thickness could be produced. Furthermore, the method can be used to make a superconductive connection between two superconductive bodies by forming the molten metal layer connecting the two bodies that are to be joined together, and exposing the combination to oxygen. This latter embodiment of the invention provides, it is believed, the only currently known way to form a high $T_c$ bond between two high $T_c$ superconductor bodies.

Figure 1:
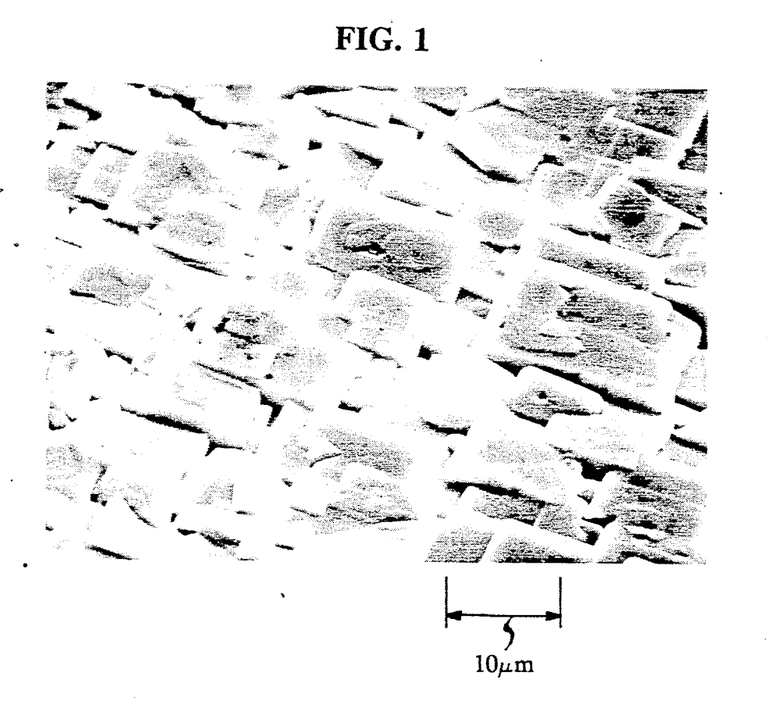
FIG. 1 shows a photomicrograph of the surface of a high $T_c$ superconductor made according to the invention on a lattice matched substrate.

FIG. 1 shows a photomicrograph of a layer of material ($YbBa_2Cu_3O_7$) formed by the inventive process on an essentially lattice matched substrate [(100)-oriented $SrTiO_3$]. As can be seen, the material is single phase, with essentially all of the material having epitaxial orientation, with the c-axis normal to the substrate.

Figure 3:
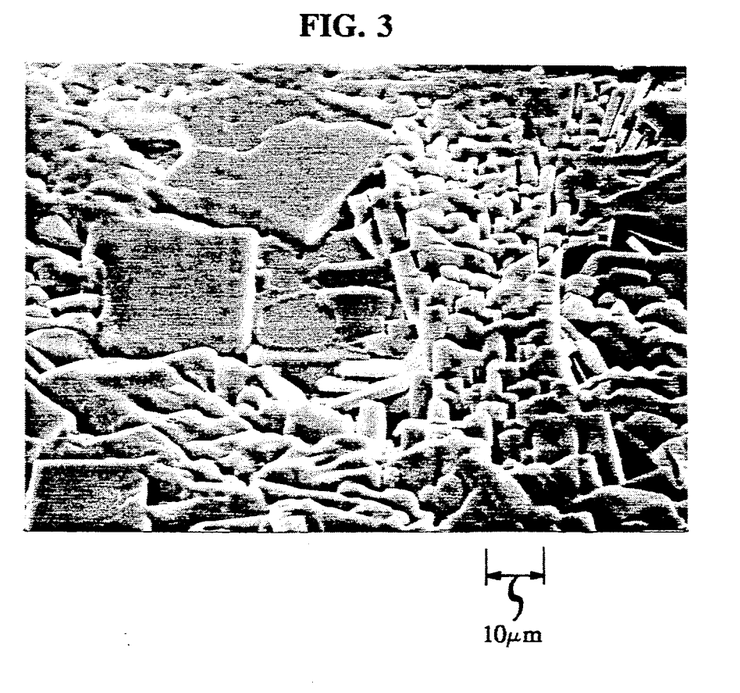
FIG. 3 shows a photomicrograph of the surface of a high $T_c$ superconductor made on a non-lattice matched substrate.

FIG. 3 similarly shows a photomicrograph of a layer of the same composition, formed in essentially the same manner, except that the substrate [(100)MgO] is not lattice matched with the material. The material is single phase, and has heavy texture, with the c-axis perpendicular to the substrate.

Superconductive bodies frequently comprise both superconductive material and normal (i.e., non-superconductive at temperatures of technological interest) metal, with the latter typically forming a cladding for the former. The cladding not only provides mechanical support and serves to electrically and thermally stabilize the superconductor but also protects the superconductor from contact with harmful agents such as water.

Figure 2:
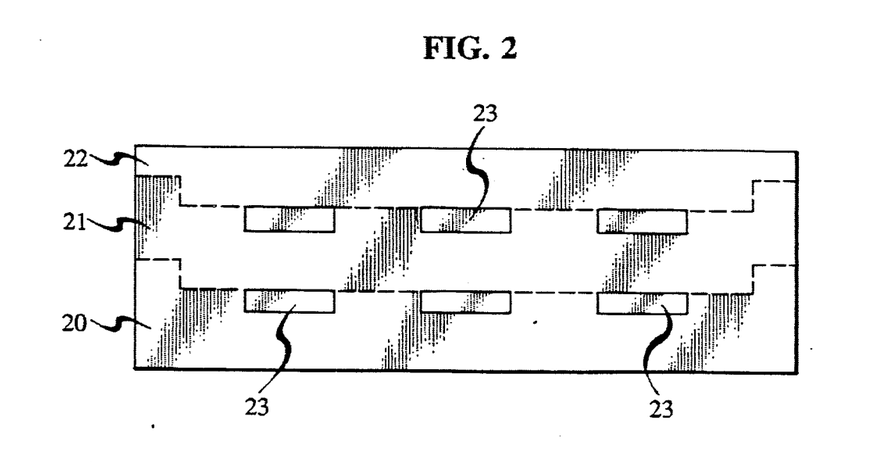
FIG. 2 schematically depicts a composite body made according to the invention.

FIG. 2 schematically depicts an exemplary body according to the invention, namely, a tape with a multiplicity of elongate superconductive bodies surrounded by normal metal cladding, wherein metal tapes 20, 21, and 22 serve as cladding for superconductive elements 23. Such a tape can be produced by, for instance, casting the melt into the grooves in tape 20 and forming the oxide according to the invention, carrying out the analogous process with tape 21, optionally heat treating the two tapes to attain the desired crystal structure and oxygen content of the superconductor elements, then assembling tapes 20, 21, and 22 into a unitary structure by some appropriate known technique such as soldering or welding. Other techniques for forming such a structure will be apparent to those skilled in the art. For instance, after completion of formation of tape 20 with the superconductors therein a layer of metal (analogous to 21) is formed on 20 by vapor deposition, grooves are formed in the layer by some appropriate process (e.g., photolithography and etching), superconductive oxide bodies are formed in the grooves by the inventive technique, and the ribbon is completed by vapor deposition of a covering layer analogous to 22. In general, it will be apparent that the inventive method is well suited for the manufacture of composite (superconductive/metal) structures by a continuous process. In particular, it is well suited for the manufacture of elongate composite bodies such as superconductive wire and tape.

A wire can exemplarily be prepared by applying the melt to a Ag (or Ag-coated or bare Cu) wire, forming the oxide from the melt, heat treating the oxide in $O_2$, and applying a layer of metal (e.g., Ag or Cd) over the oxide. If desired this process can be repeated so as to produce a wire in which annular superconductive layers alternate with annular normal metal layers.

Bodies produced according to the inventive method can be used in the same way as prior art superconductive bodies. Representative of such use are magnets and transmission lines comprising superconductive wire or tape formed according to the invention.

A significant aspect of the invention takes advantage of the observation that solidified material as initially yielded by liquid of the source (also referred to as the melt) is of a composition determined on the basis of energetics. Stated differently, atomic ratio in the solidified material and independent of, e.g., oxygen may differ from the ratio of the same atoms in the liquid. This is of particular significance in the growth of solid material in which "stoichiometric" ratio of such atoms may not conveniently yield liquid source under temperatures and/or other conditions desired in the process.

An immediate objective and therefore a significant embodiment of the invention concerns preparation of "high $T_c$" superconductor e.g., of the prototypical composition $MM'_2Cu_3O_{9-\delta}(\delta \sim 2.1)$. It is convenient to discuss the significant embodiment of the invention in terms of such superconductors although it is intended that this discussion be exemplarily only. In these terms, Example 15 herein demonstrates energetic preference for a prototypical superconductor in which M=Yb and M'=Ba, with such composition being produced from solidified product yielded by a liquid which is deficient with respect to M and M'. A particular mechanistic explanation takes the form of a free energy minimum at the interface between the substrate and the described solid, and/or at the interface between the solid and the liquid source.

The observation has application to a vast area of materials—as stated, including materials in which it is convenient to produce solid of atomic ratio from that of the liquid. It is convenient to think of this atom ratio in terms of "cation ratio", although again this terminology is adapted to expedite description and should be regarded as necessarily descriptive. In the instance of the superconductor, it may be proper to regard the final product as containing conventional cations. In other instances, it may not be proper to regard product in such terms-chemical relationship among the elements may not be strictly ionic. Generically, the overall inventive requirement continues, i.e., solid product is yielded by the liquid simply because it is somehow connected to a form in which it is not retained in the liquid state under applicable local conditions. In the instance of the superconductors, it is useful to regard the instability as resulting from a decrease in solubility brought about by (increased) chemical oxidation of the "cations" in the liquid.

The aspect of the invention under discussion requires at least two "cations" in a liquid and of course an energetic preference for a yielded solid in which the ratio of those two "cations" differs. For these purposes, we require a preference of magnitude of at least 10 atomic percent (in some instances as high as 25, 50, or even 90%) in terms of at least one such cation expressed as a percentage of the total of all such "cations" contained in the solid. (Regarding the superconductors in which under certain circumstances the initial solid is further treated to yield the ultimate product-the prototypical superconductor composition above—it is of course contemplated that "anionic" content is increased following initial solidification. This has no substantial effect in the expressed criteria—in terms of cation ratio).

Still in terms of the superconductor example, this aspect of the invention is of course applicable with the liquid composition containing additional material. Discussion elsewhere is directed to the use of such additional material serving as solvent e.g., silver. The 10 atomic % requirement continues to apply to the ratio of "cations"—in this instance, e.g., ratio of perhaps M expressed as a percentage of the totality of M+M'+Cu.

It must be kept in mind that variation in cation ratio is useful in terms of maintaining the desired liquid state in the source. While it is convenient to use the term "solvent" it should be recognized that in a very real sense, one or more of the cations required in the final product may be regarded as serving a "solvent" function. In this sense, Example 15 may be regarded as involving a liquid in which cations would be yielded to the solid from a liquid in which excess Cu serves as a solvent.

Discussion is here in terms of yielded solid. Useful processing may take advantage of such initial solid in a batch or continuous procedure. In batch processing, solidification may simply be established (e.g., by removal of wetting liquid) or it may be continued to yield overlying solid which may serve in some capacity different from that of initial solid. (In the instance of superconductors, a non-superconducting overlying solid e.g., of lesser M content, may serve a chemical function (protective) or a mechanical function. Continuous processing in which solidifying matter of the composition of the "initial solid" is continually replenished is contemplated. For example, prototypical superconductor, e.g., $YBa_2Cu_3O_x(x\sim 7)$, produced as initial solid deposited upon a continuous substrate body (e.g., a copper filament) that is continuously withdrawn from a liquid compositionally deficient in Y, while replenishing the source so as to maintain a constant source composition.

EXAMPLE 1

1.730, 2.747, and 1.906 g, respectively, of Yb, Ba, and Cu were placed in a sintered $Al_2O_3$ crucible, which was then heated, under He, to about 900° C., resulting in formation of a homogeneous melt. The melt had $T_m$ of about 850° C. A (100) oriented single crystal $SrTiO_3$ wafer, also at about 900° C., was dipped briefly into the melt, such that a liquid coating, of approximately 2 μm thickness, was formed thereon. The coated wafer was then exposed to oxygen (1 at). Solidification of the layer resulted about 1 second after the start of the exposure. The coated wafer was maintained at 900° C. in $O_2$ for about 30 minutes, followed by a slow cool (about 1 hour) in $O_2$ to 500° C., a 10 hour soak in $O_2$ at 500° C., followed by a furnace cool in $O_2$ to room temperature. The thus produced approximately 3 μm thick layer essentially had composition $YbBa_2Cu_3O_7$, $T_c(R=0)$ of 85K, $J_c(H=0, 70K)$ of about $3\times 10^4$ A/cm$^2$, and under the microscope appeared substantially as shown in FIG. 1.

EXAMPLE 2

A single phase layer was produced substantially as described in Example 1, except that the substrate was (100) MgO. The layer had $T_c(R=0)$ of 82K, $J_c(H=0, 70K)$ greater than $10^3$ A/cm$^2$, and under the microscope appeared substantially as shown in FIG. 3.

EXAMPLE 3

A single phase layer was produced substantially as described in Example 1, except that the substrate was a sintered $Al_2O_3$ wafer. The material was superconductive and had mixed texture, with c-axes perpendicular to and in the plane of the substrate.

EXAMPLE 4

A single phase layer is produced substantially as described in Example 1, except that 1.520 g of Eu are used instead of the Yb. The resulting material has $T_c(R=0)$ of about 94K and $J_c(H=0, 70K)$ of about $10^5$ A/cm$^2$. The morphology of the material is essentially as described in Example 1.

EXAMPLE 5

A homogeneous melt of composition $Y_{.01}Yb_{.99}Ba_2Cu_3$ is produced by melting 0.0089, 1.713, 2.747, and 1.906 g, respectively, of Y, Yb, Ba, and Cu at 900° C. in a $Al_2O_3$ crucible.

EXAMPLE 6

A homogeneous melt is produced by melting 0.089, 1.557, 2.747, 1.906, and 2.1 g, respectively, of Y, Yb, Ba, Cu, and Ag at 900° C. in an $Al_2O_3$ crucible.

EXAMPLE 7

A hot silver-coated copper wire is dipped, under a He ambient, into a melt (900° C.) of composition $EuBa_2Cu_3$, rapidly withdrawn, and immediately exposed to oxygen. The resulting wire, coated with solid oxide, is furnace cooled under $O_2$ to room temperature. The oxide layer is single phase and superconducting.

EXAMPLE 8

A hot copper wire is dipped, under a He ambient, into a melt (900° C.) of composition $EuBa_2Cu_{2.5}$, rapidly withdrawn, and immediately exposed to oxygen. The total time between dipping into the melt and solidification of the layer of molten material on the wire is less than 5 seconds. The resulting wire, coated with solid oxide, is furnace cooled under $O_2$ to room temperature. The oxide layer consists mostly of $EuBa_2Cu_3O_7$ and is superconducting.

EXAMPLE 9

A single phase layer is produced substantially as described in Example 4, except that the melt (and substrate) temperature is 950° C., and except that a closed crucible is used, such that the melt is in contact with Ba vapor, whereby loss of Ba from the melt is substantially avoided.

EXAMPLE 10

Two lengths of superconductive wire (nominal composition $YbBa_2Cu_3O_7$) are produced, substantially as described in U.S. patent application 036,160. The metal cladding is removed from an about 1 cm long end portion of each of the wires. The end portions are heated to about 900° C., dipped into a melt of composition $EuBa_2Cu_3$ at 900° C., the end portions are aligned side by side, brought into contact with each other, followed by exposure to oxygen and cool-down to room temperature. This procedure results in formation of a superconductive mechanical bond between the two wires.

EXAMPLE 11

A layer of superconductive oxide is formed substantially as described in Example 1, except that 2.500, 0.1175, and 0.635 g, respectively, of La, Sr, and Cu were melted in the crucible. The oxide layer essentially has composition $La_{1.8}Sr_{0.2}CuO_4$, and $T_c$ (R=0) of 36K.

EXAMPLE 12

A layer of $YbBa_2Cu_3O_7$ was formed substantially as described in Example 1, except that the melt composition was essentially $YbBa_2Cu_{2.3}$. The resulting solidified oxide film consisted of superconductive $YbBa_2Cu_3O_7$ on the substrate and had predominantly epitaxial orientation, with non-superconductive excess metal oxide on the superconductive oxide.

EXAMPLE 13

A layer of $YbBa_2Cu_3O_7$ was formed substantially as described in Example 12, except that the substrate was MgO. The resulting oxide film was substantially as described in Example 12, except that the superconductive $YbBa_2Cu_3O_7$ did not have epitaxial orientation but instead was heavily textured, with c-axis normal to the substrate.

EXAMPLE 14

An oxide film was formed on a $SrTiO_3$ substrate, substantially as described in Example 1. The melt was highly non-stoichiometric, with a composition ($Yb_2BaCu$) that corresponds to the well-known non-superconducting "green" phase. The resulting oxide film comprised a substantial portion (about 30%) of superconductive $YbBa_2Cu_3O_7$, the remainder consisting substantially of Yb-oxide and some green phase. The superconductive oxide layer had formed on the substrate, with the non-superconductive oxides formed atop the 1, 2, 3) material. Similar results were obtained with MgO and $Al_2O_3$ substrates, except that the (1, 2, 3) material was not epitaxial but had texture.

EXAMPLE 15

A charge, corresponding to a composition $YbBa_2Cu_6$, was partially melted (some solid copper remained in the melt) at 900° C., and heated MgO and $SrTiO_3$ substrates dipped into the partial melt. The coated substrates were then exposed to oxygen, substantially as described. The resulting oxide films comprised a significant portion (1, 2, 3) material, with the remainder of the oxide being copper oxide. This experiment implies that it is possible to form (1, 2, 3) material on a copper substrate.

EXAMPLE 16

A charge, corresponding to composition $YBa_2Cu_3Ag_3$, was melted and formed a homogeneous melt at 1000° C. This established the utility of silver as a homogenizer metal, since $YBa_2Cu_3$ does not form a homogeneous melt at that temperature.

EXAMPLE 17

A charge, corresponding to composition $YBa_2Cu_6$, was melted and formed a homogeneous melt at about 1000° C.

EXAMPLE 18

A melt of composition $TlBa_2Ca_2Cu_3$ was prepared by a two-step process that involved formation of two binary alloys ($TlBa_2$ and $Ca_2Cu_3$, $T_m=601°$ C. and about 700° C., respectively) by induction melting in pyrolytic boron nitride crucibles, and melting of an appropriate mixture of the binary alloys to form the desired quaternary alloy. A quantity of the thus formed quaternary alloy was heated in an alumina crucible in an inert atmosphere to a temperature (870° C.) above $T_m$. While maintaining the melt at 870° C., $O_2$ was introduced into the melt, resulting in solidification of the melt without cooling. The resulting oxide was then furnace cooled to room temperature in flowing $O_2$. X-ray diffraction showed that the thus produced material contained mostly $TlBa_2CaCu_2O_7$, $Tl_2Ba_2CaCu_2O_8$, and $Tl_2Ba_2Ca_2Cu_3O_{10}$ phases, with lattice parameters a=b=5.43 Å and c=12.6, 19.3 and 35.9 Å, respectively. The material showed onset of superconductivity at 120K, with $T_c(R=0)=113K$, and $J_c$ (obtained from dynamic hysteresis loops) at 9 kOe and 60K of $5\times10^4$ A/cm$^2$.

EXAMPLE 19

A $YbBa_2Cu_3O_7$ film on a (100) $SrTiO_3$ substrate was produced as follows. A simple apparatus (similar to liquid-phase-epitaxy apparatus) was provided. The apparatus consisted of three mating high purity alumina parts. The bottom part comprised a translation surface and guide rails such that the middle part (the translation stage) could be moved longitudinally over the bottom part in controlled manner. The translation stage was basically bar-shaped and comprised a section cut to accommodate a Ta substrate holder with a substrate therein. The top part is shaped to fit over the translation stage and to be secured to the bottom part. It also contains a "feed hole" extending vertically through the top part. The walls of the feed hole were covered by Ta foil to avoid any alloy reaction with the alumina. The apparatus was outgassed in a vacuum of $10^{-8}$ Torr at 1200° C. for several hours. Yb, Ba and Cu, in amounts to yield the desired quantity of $YbBa_2Cu_3$ melt, were assembled in a He atmosphere and melted in a pyrolytic boron nitride crucible in an induction furnance. The resulting alloy body was cut to a shape to fit the feed hole of the above described apparatus, and loaded into the feed hole, all under He. The translation stage of the apparatus was positioned such that the Ta substrate holder sealed the bottom of the feed hole and the substrate was not exposed to the alloy. The apparatus with both the charge and substrate in place was then heated under He to 900° C. in 2 hours, resulting in melting of the alloy charge ($T_m\sim870°$ C.). After waiting for 5 minutes so that the apparatus could equilibrate, the translation stage with the SrTiO₃ substrate was moved relative to the remainder of the apparatus such that the substrate was positioned underneath the feed hole, for a few seconds, and such that a clear, optically flat film of molten alloy was formed on the substrate. Immediately after coating of the substrate the translation stage was again moved relative to the remainder of the apparatus such that the film was directly exposed to the He atmosphere in the furnace, and 10% O$_2$ was introduced to the continuous He flow, all while maintaining the furnace temperature at 900° C. Solidification of the film occurred within seconds of the introduction of O$_2$ into the atmosphere. The flow of the O$_2$/He mixture was continued for several hours, and then the furnace temperature was reduced to 500° C. (from 900° C.) in two hours. The film was maintained at 500° C. for several hours under flowing O$_2$/He, followed by cooling to room temperature. The resulting YbBa$_2$Cu$_3$O$_7$ film was free of contaminants, highly textured, and revealed a superconducting transition at 90K.

EXAMPLE 20

A film of superconducting oxide material was produced substantially as described in Example 1, except that the melt composition was TlBaSrCa$_2$Cu$_3$, and the melt temperature was 870° C. The resulting film had T$_c$(R=0) of 114K.

EXAMPLE 21-23

Four Al N substrates were cleaned (10% phosphoric acid, deionized water rinse, isopropyl alcohol rinse, 200° C. bake in 10$^{-6}$ Torr vacuum), and a 200 nm thick Al layer deposited thereon (evaporated in 10$^{-7}$ Torr vacuum). Each substrate with the Al layer thereon was then inserted into a clean quartz tube and the tube evacuated. Purified Ar was then introduced into the tube, followed by re-evacuation. After repeating this several times, the tube was again filled with pure Ar, the substrate heated to 700° C. in about 10 minutes. One substrate/Al film combination was then maintained 1 hour at 700° C. in pure Ar, followed by a slow (3 hour) cool to room temperature in pure Ar. The electrical conductivity of the Al layer of this comparison sample was measured by a conventional technique, and was found to have a value of 100 (in arbitrary units). The remaining three samples were contacted with a N$_2$-containing atmosphere (100, 1, 1% N$_2$, respectively), for various periods of time (1, 5, 18 hours, respectively) at 700° C., followed by a 3 hour cool to room temperature in the respective N$_2$-containing atmosphere. The conductivity of the layer on each given Al N substrate was then measured in the same manner as that of the resolidified Al layer of the comparison sample. The measured conductivities were (in the same arbitrary units) 50, 100, and 7, respectively, indicating that for instance, the 18 hour treatment in 1% N$_2$ resulted in nearly complete transformation of the (molten) Al layer into an insulator layer. The results also indicate that 1 hour at 700° C. in 100% N$_2$ resulted in transformation of a substantial amount of the molten Al into insulating material, and that 5 hours at 700° C. in 1% N$_2$ did not result in formation of a substantial amount of the insulator. It is expected that further analysis will confirm that the thus formed insulator material is Al N.

What is claimed is:

1. A method of making an article that comprises a quantity of a superconductive oxide material containing at least two distinct metal elements M and M' and oxygen in a defined ratio x:y:z, respectively, the method comprising a) forming a melt from precursor material that contains at least one of M and M' in elemental form, the precursor material selected such that said at least two metal elements M and M' are present in the melt; and b) causing solidification of at least a part of the melt, the quantity of the superconductive oxide material being, or being derived from, said solidified part of the melt; wherein c) at least said part of the melt is at a temperature T, with T$_m$<T<T$_o$, where T$_m$ is the freezing temperature of the melt and T$_o$ is a melting temperature associated with the superconductive oxide material; and d) step b) comprises contacting at least said part of the melt with an oxygen-containing atmosphere such that the concentration of oxygen in the part of the melt is increased such that, essentially without a drop in the temperature of the part of the melt, solid product is formed from the part of the melt, said solid product containing said at least two distinct metal elements M and M' and oxygen in the ratio x:y:z', respectively, wherein z' may, but need not be, different from z.

2. The method of claim 1, wherein the melt comprises said at least two metal elements M, M' in essentially the proportion x:y.

3. The method of claim 1, wherein the melt comprises said at least two metal elements M, M' in proportion that differs from x:y.

4. The method of claim 1, wherein, prior to exposure to said oxygen-containing atmosphere, the melt is substantially oxygen-free.

5. The method of claim 1, comprising heat treating said solid product at a temperature or temperatures less than or equal to the temperature T$_o$ in an oxygen-containing atmosphere.

6. The method of claim 1, comprising contacting a substrate with said at least part of the melt, the substrate being at a temperature substantially equal to the temperature T.

7. The method of claim 1, wherein the melt comprises at least one further metal element X other than said at least two metal elements M, M'.

8. The method of claim 1, wherein said at least two metal elements M, M' are Cu, Ba, and one or more rare earth element.

9. The method of claim 1, wherein the superconductive oxide comprises a Y-containing Ba-cuprate, and the relative concentration of Y in the melt is at least 10% lower than the relative concentration of Y in said Ba-cuprate.

10. The method of claim 1, wherein the article comprises pre-existing first and second superconductive oxide bodies, and the method comprises causing the at least part of the melt to contact both the first and the second superconductive oxide body, and carrying out b) such that the solidified part of the melt joins the first to the second superconductive oxide body.

11. Method of claim 1, wherein said at least two metal elements are Cu, Ba and at least one element selected from the group consisting of Y, Eu, Nd, Sm, Gd, Dy, Ho, Er, Tm, YB, Lu, La, Sc and Sr.

12. Method of claim 1, wherein said solid product is formed substantially without a drop in the temperature of said at least part of the melt below the temperature T.

13. Method of claim 3, wherein the melt comprises said at least two metal elements M, M' in proportion that differs from x:y by an amount of at least 10 atomic %, expressed as one such element related to the totality of said at least two metal elements.

14. The method of claim 5, wherein heat treating comprises sintering at a temperature close to but less than the temperature $T_o$.

15. The method of claim 8, wherein the melt further comprises a metal element (X) chosen from the group consisting of Ag, Au, and Cd.

16. the method of claim 9, wherein the melt comprises Ag.

17. The method of claim 9, wherein the Y-containing Ba-cuprate has nominal composition $YBa_2Cu_3O_7$.

18. The method of claim 9, comprising contacting a substrate with said at least part of the melt, the substrate being at a temperature above $T_m$, wherein at least a portion of the substrate consists substantially of copper.

* * * * *